United States Patent
Cathelin et al.

(10) Patent No.: US 9,455,689 B2
(45) Date of Patent: Sep. 27, 2016

(54) CURRENT SOURCE ARRAY

(71) Applicants: STMICROELECTRONICS SA, Montrouge (FR); UNIVERSITY OF TWENTE, Enschede (NL)

(72) Inventors: Andreia Cathelin, Laval (FR); Bram Nauta, Borne (NL)

(73) Assignees: STMICROELECTRONICS SA, Montrouge (FR); UNIVERSITY OF TWENTE, Enschede (NL)

( * ) Notice: Subject to any disclaimer, the term of this patent is extended or adjusted under 35 U.S.C. 154(b) by 13 days.

(21) Appl. No.: 14/547,684

(22) Filed: Nov. 19, 2014

(65) Prior Publication Data

US 2015/0137874 A1    May 21, 2015

(30) Foreign Application Priority Data

Nov. 20, 2013  (FR) ...................... 13 61410

(51) Int. Cl.
*H01L 21/8238*   (2006.01)
*H01L 29/66*   (2006.01)
(Continued)

(52) U.S. Cl.
CPC .............. *H03K 3/012* (2013.01); *H01L 21/84* (2013.01); *H01L 27/1203* (2013.01); *H01L 29/78603* (2013.01); *H01L 29/78648* (2013.01)

(58) Field of Classification Search
CPC .......... H01L 21/8238; H01L 27/0922; H01L 27/11807; H01L 2027/11807; H01L 21/76897; H01L 21/8224; H01L 21/8228; H01L 21/8234; H01L 21/823885; H01L 29/0847; H01L 29/42316; H01L 29/42384; H01L 29/66

USPC .......... 257/20, 194, 135–136, 213–413, 900, 257/902–903; 438/136, 137, 156, 173, 192, 438/206, 212, 424, 427, 428, 591
See application file for complete search history.

(56) References Cited

U.S. PATENT DOCUMENTS

2002/0149059 A1* 10/2002 Ker et al. ...................... 257/355
2010/0328826 A1* 12/2010 Salman ................... H01L 21/84
                                                    361/56
(Continued)

FOREIGN PATENT DOCUMENTS

JP    2000-196089    7/2014
WO    2012/161859    11/2012

OTHER PUBLICATIONS

Noel et al., Multi-VT UTBB FDSOI Device Architectures for Lower-Power CMOS Circuit, IEEE Transactions on Electron Devices, IEEE Service Center, Piscataway, NJ, US, vol. 58, No. 8, Aug. 1, 2011, pp. 2473-2482.

(Continued)

*Primary Examiner* — Julio J Maldonado
*Assistant Examiner* — Moin Rahman
(74) *Attorney, Agent, or Firm* — Allen, Dyer, Doppelt, Milbrath & Gilchrist, P.A.

(57) ABSTRACT

A Silicon On Insulator current source array includes input control for receiving a control voltage, a first reference input for receiving a first reference voltage, and a second reference input for receiving a second reference voltage. A chain of several Silicon On Insulator MOS transistors, of the same type, have control electrodes all connected to the input control, first conduction electrodes are all connected to the first reference input, and second conduction electrodes are respectively connected to the second reference input through several load circuits respectively configured to be traversed by several currents when the several transistors are ON upon application of the control voltage on the input control. An input bias is coupled to a semiconductor well located below an insulating buried layer located below the chain of transistors for receiving a biasing voltage difference.

15 Claims, 6 Drawing Sheets

(51) Int. Cl.
*H03K 3/012* (2006.01)
*H01L 21/84* (2006.01)
*H01L 29/786* (2006.01)
*H01L 27/12* (2006.01)

(56) References Cited

U.S. PATENT DOCUMENTS

2012/0032733 A1* 2/2012 Negoro .................. 327/537
2012/0051154 A1* 3/2012 Son et al. ................ 365/189.07
2012/0068239 A1* 3/2012 Kim ........................ 257/296

OTHER PUBLICATIONS

Grenouillet et al., UTBB FDSOI Transistors with Dual STI for a Multi-VT Strategy at 20nm Node and Below, 2012 IEEE International Electron Devices Meeting, Dec. 10-13, 2012, pp. 3.6.1-3.6.4, Piscataway, NJ, USA.

* cited by examiner

CURRENT SOURCE ARRAY

FIELD OF THE INVENTION

The invention relates to microelectronics and especially to current sources arrays.

BACKGROUND OF THE INVENTION

Many circuits need an array of current sources, in particular digital to analog converters (DAC), filters, controlled amplifiers, controlled oscillators. The conventional current sources arrays have a large area, are power hungry and have a design complexity.

SUMMARY OF THE INVENTION

According to an embodiment, a current source array is proposed which offers a lower power consumption, a lower complexity and a lower area.

According to an embodiment the current source array uses advantageously a chain of Silicon On Insulator (SOI) transistors, in particular Ultra Thin Body and Box Fully Depleted Silicon On Insulator (UTBB FDSOI) transistors, of the same type (for example NMOS or PMOS transistors) and the biasing of a back gate (ground plane) through the resistive path of the underlying semiconductor well to provide the transistors with different threshold voltages, and obtaining thus different current values.

According to an aspect, a Silicon On Insulator current source array, in particular an Ultra Thin Body and Box Fully Depleted Silicon On Insulator current source array, is proposed which includes input control for receiving a control voltage, a first reference input for receiving a first reference voltage, for example ground, and a second reference input for receiving a second reference voltage, for example power. A chain of several Silicon On Insulator MOS transistors of the same type (NMOS or PMOS) and having control electrodes are all connected to the input control, first conduction electrodes are all connected to the first reference input, and second conduction electrodes are respectively connected to the second reference input through several load circuits (passive or active) respectively configured to be traversed by several currents when the several transistors are ON upon application of the control voltage on the input control. And an input bias is coupled to a semiconductor well located below an insulating buried layer located below the chain of transistors for receiving a biasing voltage difference.

Because the transistor bodies are not connected to ground or power but are coupled to the semiconductor well through the insulating buried layer (BOX), applying the biasing voltage difference on the semiconductor well leads to apply a voltage just under the part of the insulating buried layer located below the transistors, this voltage being different from one transistor to another because of the intrinsic resistive path of the semiconductor well. This changes the electrostatic control of the transistors and shifts their threshold voltage and permits thus to obtain different current values. In other word the transistors have a separate body bias accessible through the intrinsic resistive path of the semiconductor well.

A particularly compact current source array having a lower power consumption and a lower complexity, can thus be obtained.

According to an embodiment, the input bias comprises a first semiconductor contact region for receiving a first biasing voltage and coupled to a first zone of the semiconductor well located below the first transistor of the chain, and a second semiconductor contact region for receiving a second biasing voltage and coupled to a second zone of the semiconductor well located below the last transistor of the chain. The first and second zones are mutually coupled by a resistive zone (path) of the semiconductor well extending between the first and second zones. And the resistive path is coupled to the bodies of the transistors of the inverting cells through the insulating buried layer (BOX).

Although it is not necessary, it is preferable that all the MOS transistors have the same channel width (W) and channel length (L). This permits in particular an easier adjustment of the different threshold voltages. It is also preferable that the space between two transistors of the chain be the same. This permits to have a constant gradient of threshold voltages, and thus a constant gradient of current values. The MOS transistors may be for example LVT (Low Threshold Voltage) MOS transistors or RVT (Regular Threshold Voltage) MOS transistors.

According to another aspect an integrated circuit is proposed, comprising a Silicon On Insulator current source array as defined above.

BRIEF DESCRIPTION OF THE DRAWINGS

Other advantages and features of the embodiments will appear on reviewing the detailed description of embodiments, these being in no way limiting, and of the appended drawings in which.

DETAILED DESCRIPTION OF THE PREFERRED EMBODIMENTS

Figure 1:
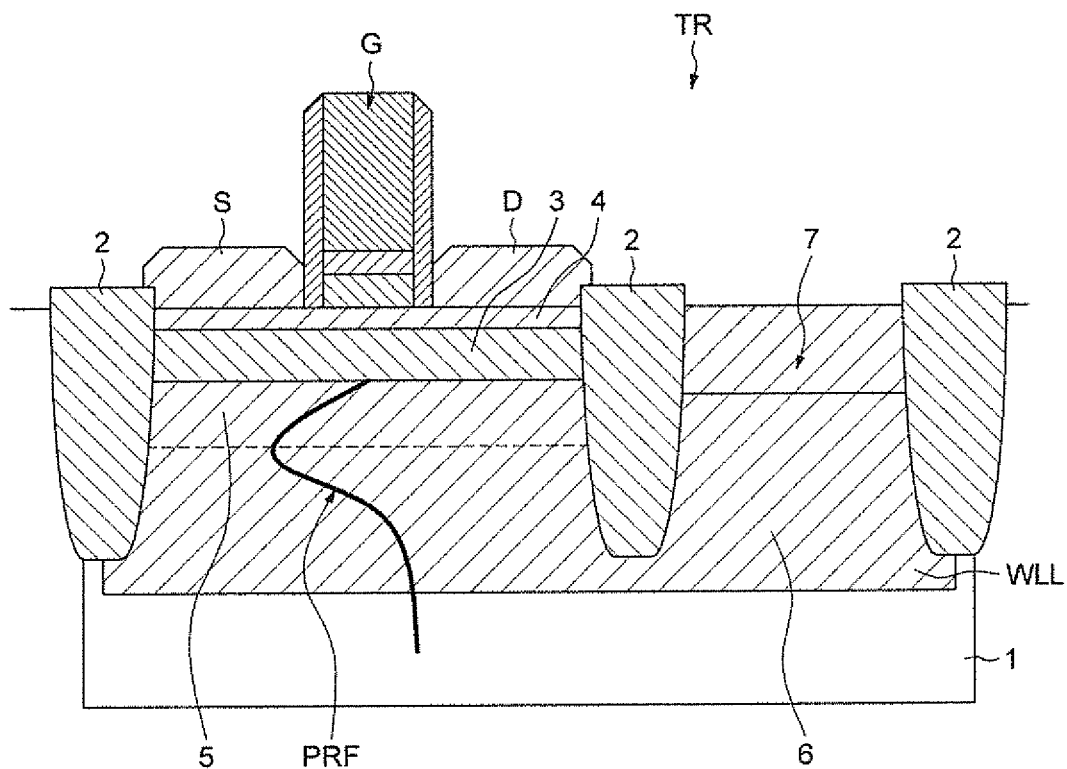
FIG. 1 is a cross-sectional view illustrating a known structure of an UTBB FDSOI transistor.

Particular embodiments of the present embodiments using the "UTBB FDSOI" technology will be now described. In FIG. 1, the MOS transistor TR is realized on and above a Silicon On insulator (SOI) substrate which is here an UTBB FDSOI substrate. The SOI transistor TR is thus called a "UTBB FDSOI" transistor. It includes a semiconductor film region 4 laterally limited by an insulating region 2. An insulating buried layer 3, known by those skilled in the art as a "box", is located below the semiconductor film region 4 and above a supporting substrate 1.

The supporting substrate 1 includes here a semiconductor well WLL containing a buried electrode 5 which is also referred to as a "ground plane". This ground plane 5 is located below the insulating buried layer 3. Generally, the ground plane 5 is obtained by a high energy dopant implantation and thus has a dopant profile PRF as illustrated in FIG. 1. Consequently, the ground plane 5 is more doped than the remaining part of the well WLL. The well WLL further comprises a contact region 7 which is more doped than the underlying part 6 of the well WLL. This contact region permits to bias the semiconductor well WLL and consequently the ground plane 5 which accordingly acts for the transistor as a "back gate". And, as illustrated in FIG. 1, for realizing this contact region 7, the box 3 has been opened. The contact region 7 is also laterally limited by the insulating region 2.

In an UTBB technology, the thickness of the semiconductor film 4 is about 10 nanometers while the thickness of the box 3 is about 20 to 30 nanometers. In an UTBB FDSOI technology, the semiconductor film is further fully depleted, which means that the doping of the semiconductor film 4 is the one of the intrinsic semiconductor material, for example the one of the intrinsic silicon. The source and drain regions S and D are generally realized by epitaxy above the semiconductor film 4. And, conventionally, the MOS transistor TR comprises an isolated gate region 2 including a gate material which can comprise metallic layer and/or polysilicon layer for example.

Figure 2:
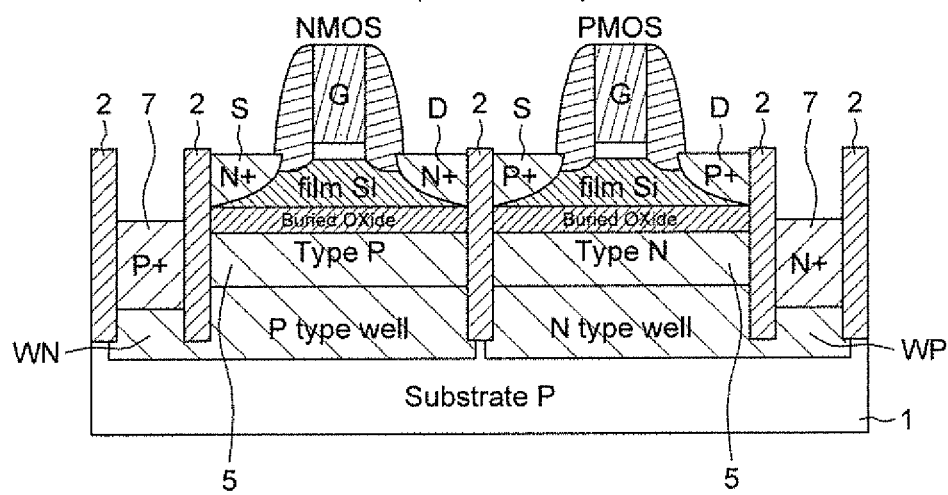
FIGS. 2 and 3 are cross-sectional views illustrating different types of known UTBB FDSOI transistors.
Figure 3:
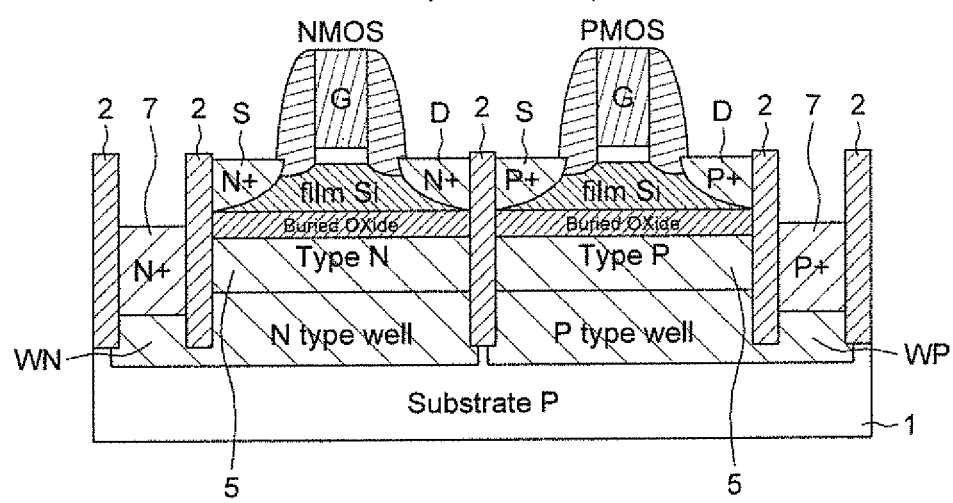

As illustrated diagrammatically in FIGS. 2 and 3, it is possible, depending on the type of the well, to have different families of MOS transistors. More precisely, in FIG. 2, the PMOS transistor is arranged above a N type well WP within a P substrate 1 while the NMOS transistor is arranged above a P type well WN within the substrate 1. Accordingly, such transistors are so-called RVT transistors, that is, transistors which have regular threshold voltage. And, in FIG. 2, this configuration is a standard well and ground plane configuration.

By contrast, in FIG. 3, the configuration is a so-called "flipped well and ground plane configuration". More precisely, the PMOS transistor is arranged above a P type well WP while the NMOS transistor is arranged above a N type well WN. Those transistors are thus so-called LVT transistors, that is, transistors which have low threshold voltages.

Figure 4:
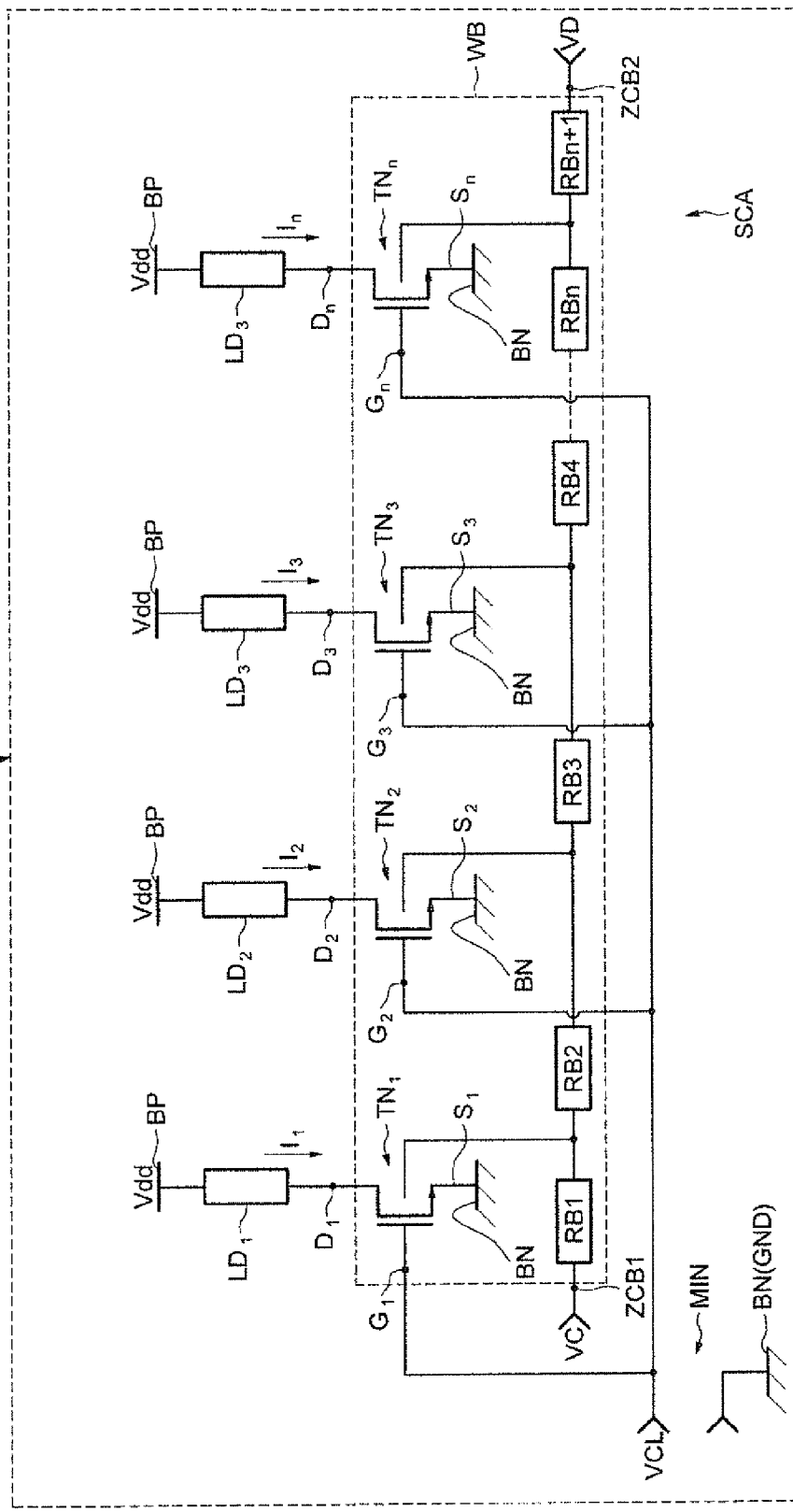
FIGS. 4 to 7 are schematic diagrams illustrating the current source array with UTBB FDSOI transistors, of the same type, and the biasing of a back gate, in accordance with present embodiments.

FIG. 4 illustrates an embodiment of an UTBB SOI current source array SCA according to the present embodiments which may be incorporated in an integrated circuit IC. More precisely, the current source array SCA comprises input control MIN for receiving a control voltage VCL, a first reference input BN for receiving a reference voltage, here ground GND, and a second reference input BP for receiving a second reference voltage, here power voltage Vdd.

The current source array SCA comprises also a chain of UTBB FDSOI NMOS transistor $TN_1$-$TN_n$. Each control electrode $G_i$ of a transistor is connected to the input control MIN. Each transistor $TN_i$ has a first conduction electrode $S_i$, here the source, connected to the first reference input BN and a second conduction electrode $D_i$ here the drain, connected to the second reference input BP through a load circuit $LD_i$ (which can be a passive or an active load). This load circuit $LD_i$ is configured to be traversed by a current $I_i$ when the corresponding transistor $TN_i$ is ON upon application of the control voltage VCL on the input control means MIN.

Practically, the value of the control voltage VCL as well as the value of the threshold voltage $VT_i$ of the transistor $TN_i$ are chosen such that the transistor is ON. The control voltage VCL is greater than the threshold voltage $VT_i$ and has practically a large value.

In the present embodiment, the chain of NMOS transistor TNi is arranged above a semiconductor well WB. And, the current source array further comprises an input bias ZCB1, ZCB2 coupled to the semiconductor well WB for receiving a biasing voltage difference VC−VD. More precisely, the input bias comprises a first semiconductor contact region ZCB1 for receiving the first biasing voltage VC. This contact region ZCB1 is coupled a first zone of the semiconductor well WE located below the first NMOS transistor $TN_1$ of the chain. The input bias further comprises a second semiconductor contact region ZCB2 for receiving the second biasing voltage VD. This second contact region ZCB2 is coupled to a second zone of the semiconductor well WB located below the last NMOS transistor $TN_n$ of the chain.

The first and second zones are mutually coupled by the resistive zone (path) of the first semiconductor well WB extending between the first and second zones.

And, in FIG. 4, the resistors $RB_1$-$RB_{n+1}$ represent the resistive path of the semiconductor well WB between the contact zone ZCB1 and contact zone ZCB2. And, coupling the transistor bodies to the bias network ZCB1-$RB_1$-$RB_{+1}$-ZCB2 in the circuit layout rather than to power or ground leads to apply a voltage just under the part of the box below each NMOS transistor, this voltage being different from one transistor to another because of the intrinsic resistive path of the well WB. This changes the electrostatic control of the transistors and shifts their threshold voltage $VT_i$.

More precisely, the threshold voltage VT of a NMOS transistor decreases when the body biasing of this transistor increases from 0 to Vdd in absolute value. For example, in a 28 nm UTBB-FDSOI technology, the decreasing of the threshold voltage is about 80 mV/V for thin gate oxide transistors and about 140 mV/V for thick gate oxide transistors. Thus, if the VC voltage is the highest voltage, for example 2 volts, and VD is the lowest voltage, for example ground, the body biasing of the NMOS transistor $TN_i$ decreases from the first transistor $TN_1$ until the last transistor $TN_n$ because of the resistive path of the semiconductor well between contact regions ZCB1 and ZCB2. And, each current $I_i$ delivered by the current source array is proportional to $(VCL-VT_i)^2$. Thus, by changing the value of VT, the value of each current $I_i$ is different.

Figure 5:
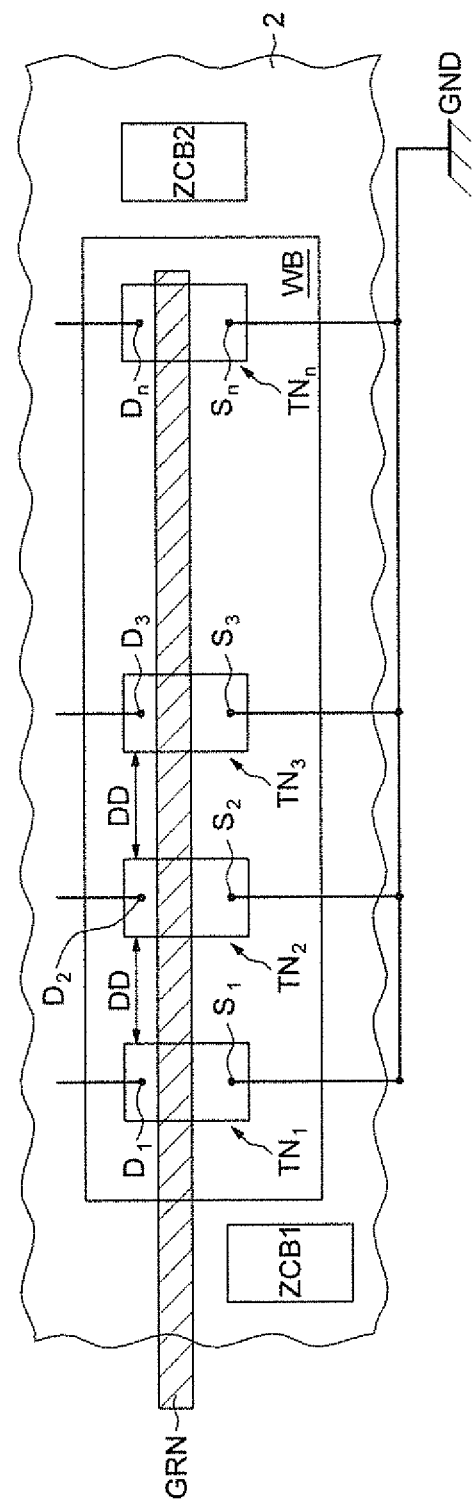
Figure 6:
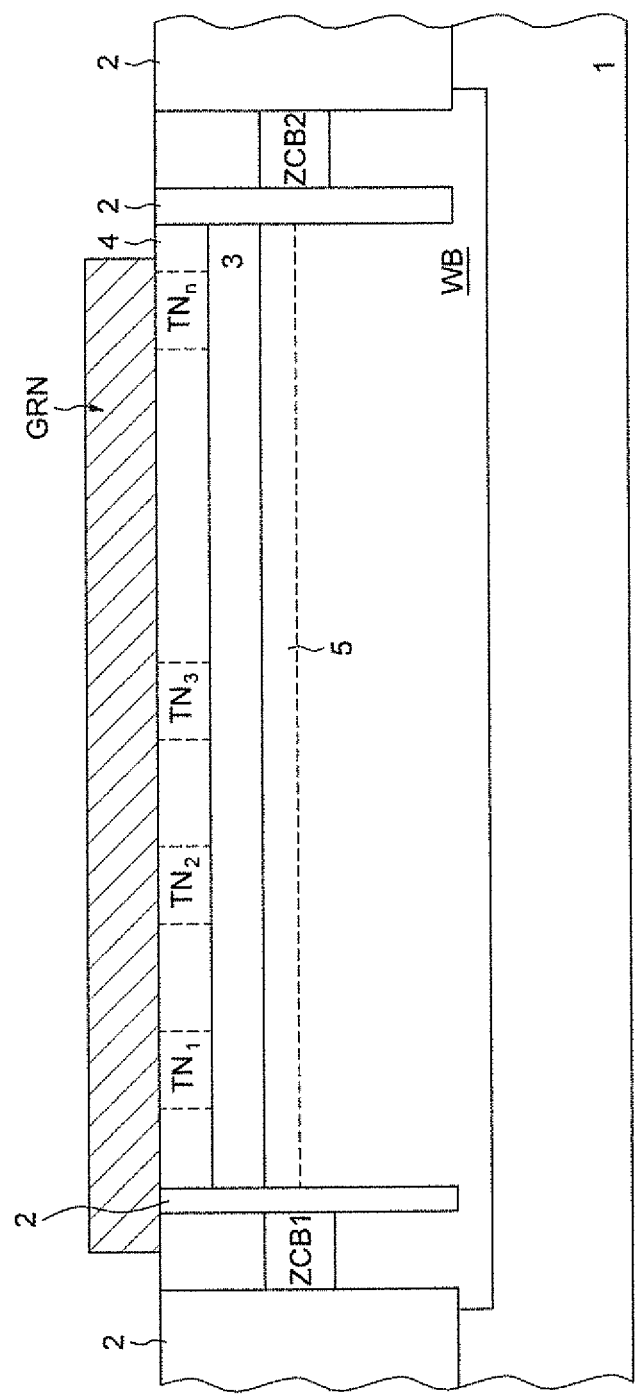

An example of layout of such a current source array SCA is illustrated in FIGS. 5 and 6. More precisely, the NMOS transistors $TN_1$-$TN_n$ are arranged on and above the semiconductor film region located above the semiconductor well WE. Holes in the insulating region 2 surrounding the semiconductor well WB and in the underlying insulating buried layer 3 permits to realize the semiconductor contact regions ZCB1 and ZCB2. Further, the gate region of all the transistors are mutually connected and form a branch GRN. In this layout, the NMOS transistors have preferably a same channel width (W) and channel length (L).

As it is well known by those skilled in the art, the threshold voltage of a MOS transistor depends also on the length (L) and the width (W). Thus, if all the transistors of a chain have the same width (W) and length (L), the adjustment of the different threshold voltages depends only on the voltage differences applied at the two ends of the chain.

It may be possible to not have the same width (W) and length (L) for the transistors of a chain. However, in such a case, it may be more complicated to adjust the different threshold voltages. Also, in this embodiment, the space DD between two transistors is the same. This permits to have a constant threshold voltage gradient. The NMOS transistors may be LVT or RVT transistors.

Figure 7:
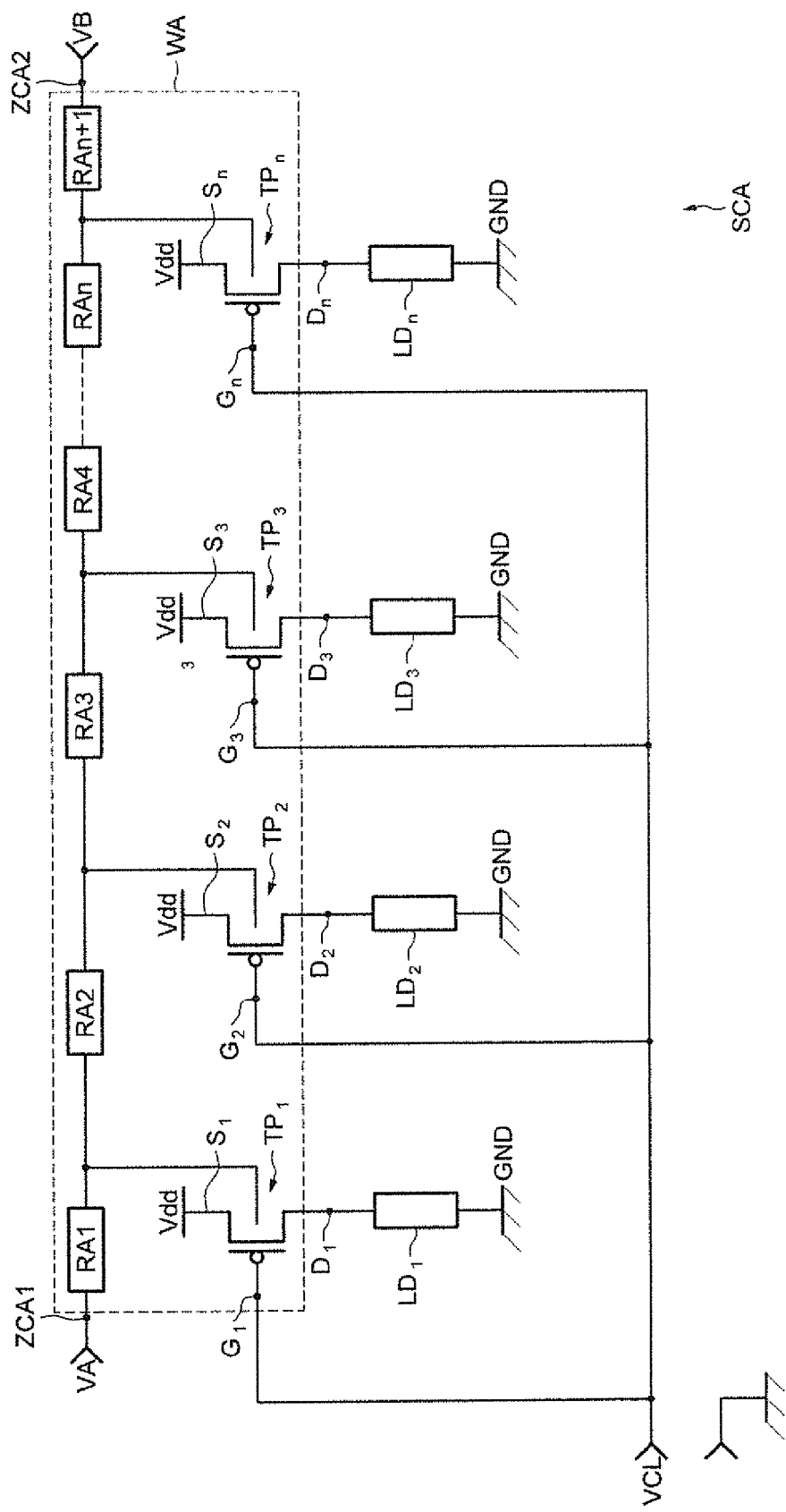

As illustrated in FIG. 7, it is also possible to realize the current source array SCA with a chain of PMOS transistors $TP_1$-$TP_n$ all arranged on a semiconductor well WA. The PMOS transistors may be LVT or RVT transistors. The source $S_i$ of the transistor TPi is connected to a power voltage Vdd while the drain $D_i$ of the transistor is connected to ground through the load circuit $LD_i$.

By analogy with the above description related to NMOS transistors, the input bias comprises here a first semiconductor contact region ZCA1 for receiving the biasing voltage VA. This semiconductor contact region ZCA1 is coupled to a first zone of the semiconductor well WA located below the first PMOS transistor $TP_1$ of the chain. The input bias further comprises another semiconductor contact region ZCA2 for receiving the biasing voltage VB. This semiconductor contact region ZCA2 is coupled a second zone of the semiconductor well WA located below the last PMOS transistor $P_n$ of the chain.

And, again, these two semiconductor contact regions ZCA1 and ZCA2 are mutually coupled by the resistive zone (path) of the second semiconductor well WA between the first and second zones ZCA1 and ZCA2. And, resistors $RA_1$-$RA_{n+1}$ represent the resistive path of the semiconductor well WA between contact regions ZCA1 and ZCA2.

And, by analogy with the above explanation related to NMOS transistor, if VA is the highest voltage in absolute value, for example 2 volts, and VB is the lowest absolute voltage, for example ground, the first PMOS transistor $TP_1$ will have the highest threshold voltage in absolute value whereas the last transistor $TP_n$ will have the lowest threshold voltage in absolute value.

The invention claimed is:

1. A Silicon On Insulator (SOI) current source array comprising:
    an input control configured to receive a control voltage;
    a first reference input configured to receive a first reference voltage;
    a second reference input configured to receive a second reference voltage;
    a plurality of load circuits coupled to the second reference input;
    a chain of SOI MOS transistors of a same type and each having a control electrode coupled to the input control, a first conduction electrode coupled to the first reference input, and a second conduction electrode coupled to the second reference input via a respective load circuit configured to conduct a current when the chain of SOI MOS transistors are active upon application of the control voltage on the input control;
    an insulating buried layer located below the chain of SOI MOS transistors;
    a semiconductor well located below the insulating buried layer; and
    an input bias circuit coupled to the semiconductor well located below the insulating buried layer below the chain of SOI MOS transistors to receive a biasing voltage, and each transistor body of the chain of SOI MOS transistors being electrically coupled to the input bias circuit through the semiconductor well.

2. The SOI current source array according to claim 1, wherein said input bias circuit comprises:
    a first semiconductor contact region to receive a first biasing voltage and coupled to a first zone of the semiconductor well located below a first transistor of the chain;
    a second semiconductor contact region to receive a second biasing voltage and coupled to a second zone of the semiconductor well located below a last transistor of the chain; and
    a resistive zone of said semiconductor well extending between and mutually coupling the first and second zones.

3. The SOI current source array according to claim 1, wherein each of the SOI MOS transistors have a same channel width and channel length.

4. The SOI current source array according to claim 1, wherein a space between two SOI MOS transistors of the chain of SOI MOS transistors is the same.

5. The SOI current source array according to claim 1, wherein the chain of SOI MOS transistors comprises a chain of Ultra Thin Body and Box Silicon On Insulator (UTBB FDSOI) transistors to define a UTBB FDSOI current source array.

6. An integrated circuit comprising:
    a Silicon On Insulator (SOI) current source array including
    an input control configured to receive a control voltage,
    a first reference input configured to receive a first reference voltage,
    a second reference input configured to receive a second reference voltage,
    a plurality of load circuits coupled to the second reference input,
    a chain of SOI MOS transistors of the same type and each having a control electrode coupled to the input control, a first conduction electrode coupled to the first reference input, and a second conduction electrode coupled to the second reference input via a respective load circuit configured to conduct a current when the chain of SOI MOS transistors are active upon application of the control voltage on the input control,
    an insulating buried layer located below the chain of SOI MOS transistors,
    a semiconductor well located below the insulating buried layer, and
    an input bias circuit coupled to the semiconductor well located below the insulating buried layer below the chain of SOI MOS transistors to receive a biasing voltage, and each transistor body of the chain of SOI MOS transistors being electrically coupled to the input bias circuit through the semiconductor well.

7. The integrated circuit according to claim 6, wherein said input bias circuit comprises:
    a first semiconductor contact region to receive a first biasing voltage and coupled to a first zone of the semiconductor well located below a first transistor of the chain;
    a second semiconductor contact region to receive a second biasing voltage and coupled to a second zone of the semiconductor well located below a last transistor of the chain; and
    a resistive zone of said semiconductor well extending between and mutually coupling the first and second zones.

8. The integrated circuit according to claim 6, wherein each of the SOI MOS transistors have a same channel width and channel length.

9. The integrated circuit according to claim 6, wherein a space between two SOI MOS transistors of the chain of the SOI MOS transistors is the same.

10. The integrated circuit according to claim 6, wherein the chain of SOI MOS transistors comprises a chain of Ultra Thin Body and Box Silicon On Insulator (UTBB FDSOI) transistors to define a UTBB FDSOI current source array.

11. A method of making a Silicon On Insulator (SOI) current source array, the method comprising:
    providing an input control configured to receive a control voltage, a first reference input configured to receive a first reference voltage, and a second reference input configured to receive a second reference voltage;
    forming a chain of SOI MOS transistors of the same type and each having a control electrode coupled to the input control, a first conduction electrode coupled to the first reference input, and a second conduction electrode coupled to the second reference input via a respective load circuit configured to conduct a current when the chain of SOI MOS transistors are active upon application of the control voltage on the input control;

forming an insulating buried layer below the chain of SOI MOS transistors;

forming a semiconductor well located below the insulating buried layer; and coupling an input bias circuit to the semiconductor well located below the insulating buried layer below the chain of SOI MOS transistors to receive a biasing voltage, and each transistor body of the chain of SOI MOS transistors being electrically coupled to the input bias circuit through the semiconductor well.

12. The method according to claim 11, wherein the input bias circuit comprises:

a first semiconductor contact region to receive a first biasing voltage and coupled to a first zone of the semiconductor well located below a first transistor of the chain;

a second semiconductor contact region to receive a second biasing voltage and coupled to a second zone of the semiconductor well located below a last transistor of the chain; and a resistive zone of said semiconductor well extending between and mutually coupling the first and second zones.

13. The method according to claim 11, wherein each of the SOI MOS transistors have a same channel width and channel length.

14. The method according to claim 11, wherein a space between two SOI MOS transistors of the chain of the SOI MOS transistors is the same.

15. The method according to claim 11, wherein the chain of SOI MOS transistors comprises a chain of Ultra Thin Body and Box Silicon On Insulator (UTBB FDSOI) transistors to define a UTBB FDSOI current source array.

* * * * *